United States Patent
Ka

(10) Patent No.: US 9,947,384 B1
(45) Date of Patent: Apr. 17, 2018

(54) SEMICONDUCTOR DEVICE RELATING TO GENERATE TARGET ADDRESS TO EXECUTE A REFRESH OPERATION

(71) Applicant: Sk hynix Inc., Icheon-si, Gyeonggi-do (KR)

(72) Inventor: Dong Yoon Ka, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/490,035

(22) Filed: Apr. 18, 2017

(30) Foreign Application Priority Data

Sep. 28, 2016 (KR) .................. 10-2016-0125090

(51) Int. Cl.
*G11C 7/00* (2006.01)
*G11C 11/408* (2006.01)
*G11C 11/406* (2006.01)

(52) U.S. Cl.
CPC .......... *G11C 11/408* (2013.01); *G11C 11/406* (2013.01)

(58) Field of Classification Search
CPC ............................ G11C 11/408; G11C 11/406
USPC .................................... 365/222, 236, 230.02
See application file for complete search history.

(56) References Cited

U.S. PATENT DOCUMENTS

| | | | |
|---|---|---|---|
| 2008/0239853 A1* | 10/2008 | Chun | ................... G11C 11/406 365/222 |
| 2012/0106283 A1* | 5/2012 | Yang | ..................... G11C 29/20 365/222 |
| 2014/0173180 A1 | 6/2014 | d'Abreu et al. | |
| 2017/0140811 A1* | 5/2017 | Joo | ................... G11C 11/40618 |
| 2017/0154688 A1* | 6/2017 | Kim | .................... G06F 11/1451 |

FOREIGN PATENT DOCUMENTS

| | | |
|---|---|---|
| KR | 1020150002128 A | 1/2015 |
| KR | 1020150041393 A | 4/2015 |

* cited by examiner

*Primary Examiner* — Connie Yoha
(74) *Attorney, Agent, or Firm* — William Park & Associates Ltd.

(57) ABSTRACT

A semiconductor device may be provided. The semiconductor device may include a target address storage circuit and a first row address generation circuit. The target address storage circuit may be configured to count the number of times that blocks are selected by a plurality of logic level combinations of an address based on an active pulse. The target address storage circuit may be configured to store and output the address of a target block, which is selected at least a predetermined number of times, among the blocks as a target address. The first row address generation circuit may be configured to generate a first row address, which is counted, from the target address based on a first internal command.

20 Claims, 8 Drawing Sheets

FIG.6

| A<1> | A<2> | A<3> | A<4> | A<5> | A<6> | |
|---|---|---|---|---|---|---|
| 0 | 0 | 0 | 0 | 0 | 0 | |
| 0 | 0 | 0 | 0 | 0 | 1 | BLOCK1 |
| 0 | 0 | 0 | 0 | 1 | 0 | |
| 0 | 0 | 0 | 0 | 1 | 1 | |
| 1 | 0 | 0 | 0 | 0 | 0 | |
| 1 | 0 | 0 | 0 | 0 | 1 | BLOCK2 |
| 1 | 0 | 0 | 0 | 1 | 0 | |
| 1 | 0 | 0 | 0 | 1 | 1 | |
| 0 | 1 | 0 | 0 | 0 | 0 | |
| 0 | 1 | 0 | 0 | 0 | 1 | BLOCK3 |
| 0 | 1 | 0 | 0 | 1 | 0 | |
| 0 | 1 | 0 | 0 | 1 | 1 | |
| ⋮ | | | | | ⋮ | |
| 1 | 1 | 1 | 1 | 0 | 0 | |
| 1 | 1 | 1 | 1 | 0 | 1 | BLOCK16 |
| 1 | 1 | 1 | 1 | 1 | 0 | |
| 1 | 1 | 1 | 1 | 1 | 1 | |

SEMICONDUCTOR DEVICE RELATING TO GENERATE TARGET ADDRESS TO EXECUTE A REFRESH OPERATION

CROSS-REFERENCE TO RELATED APPLICATIONS

The present application claims priority under 35 U.S.C 119(a) to Korean Application No. 10-2016-0125090, filed on Sep. 28, 2016, which is herein incorporated by references in its entirety.

BACKGROUND

1. Technical Field

Embodiments of the present disclosure may generally relate to a semiconductor device, and more particularly, to address counting.

2. Related Art

Each semiconductor device, for example, a dynamic random access memory (DRAM) device includes a plurality of cell arrays for storing data. Each of the plurality of cell arrays consists of a plurality of memory cells. Each of the memory cells (i.e., DRAM cells) is configured to include a cell capacitor and a cell transistor. The DRAM devices store data therein by discharging or charging the cell capacitors. Once the cell capacitor is charged to store a datum therein, an amount of electric charge stored in the cell capacitor has to be constant, ideally, even though time elapses. However, the amount of electric charges stored in the cell capacitor may actually vary because of a voltage difference between the cell capacitor and a circuit adjacent to the cell capacitor or because of a leakage current of the cell capacitor. In particular, if the amount of electric charges stored in the cell capacitor is reduced, the cell capacitor may lose a datum stored therein to cause malfunction of the DRAM device. Thus, the DRAM devices may require a refresh operation to prevent the memory cells from losing their data.

As semiconductor devices become more highly integrated with the development of process technologies, a distance between the memory cells as well as a distance between word lines connected to the memory cells has been continuously reduced. If the distance between the word lines is reduced, data stored in the adjacent memory cells may be changed or lost due to a coupling phenomenon or an interference phenomenon between the word lines. That is, if the interference phenomenon between the adjacent word lines occurs, the cells connected to the adjacent word lines may easily lose their data.

SUMMARY

According to an embodiment, a semiconductor device may be provided. The semiconductor device may include a target address storage circuit and a first row address generation circuit. The target address storage circuit may be configured to count the number of times that blocks are selected by a plurality of logic level combinations of an address based on an active pulse. The target address storage circuit may be configured to store and output the address of a target block, which is selected at least a predetermined number of times, among the blocks as a target address. The first row address generation circuit may be configured to generate a first row address, which is sequentially counted, from the target address based on a first internal command.

According to an embodiment, a semiconductor device may include a command selection and transmission (selection/transmission) circuit, a target address storage circuit, a first row address generation circuit, a second row address generation circuit, and an address selection circuit. The command selection/transmission circuit may be configured to receive a command to output the command as a first internal command or a second internal command, based on a test flag. The target address storage circuit may be configured to count the number of times that blocks are selected by a plurality of logic level combinations of an address based on an active pulse. The target address storage circuit may be configured to store and output the address of a target block, which is selected at least a predetermined number of times, among the blocks as a target address. The first row address generation circuit may be configured to generate a first row address, which is counted, from the target address based on the first internal command. The second row address generation circuit may be configured to generate a second row address based on the second internal command. The address selection circuit may be configured to output the first row address or the second row address as a selected row address for executing a refresh operation.

BRIEF DESCRIPTION OF THE DRAWINGS

FIG. 6 is a table illustrating a representation of an example of an operation of the semiconductor device illustrated in FIGS. 1 to 5.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices counting addresses.

Figure 1:
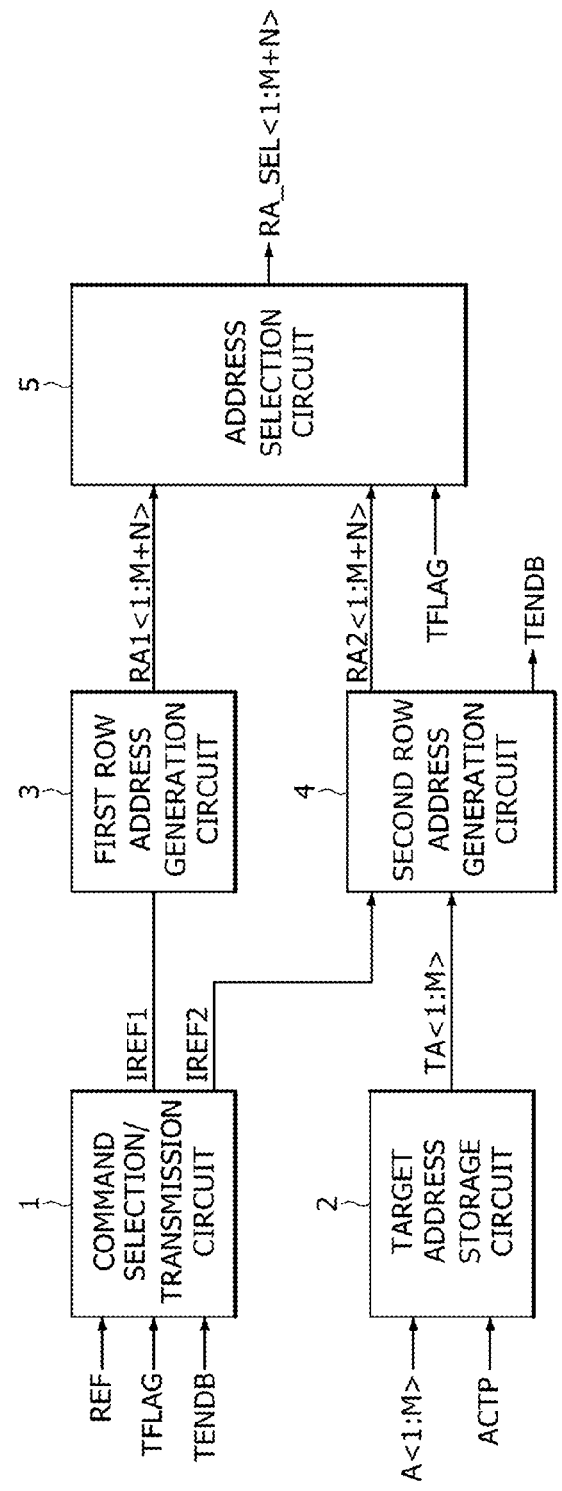
FIG. 1 is a block diagram illustrating a representation of an example of a configuration of a semiconductor device according to an embodiment.

Referring to FIG. 1, a semiconductor device according to an embodiment may include a command selection and transmission (selection/transmission) circuit 1, a target address storage circuit 2, a first row address generation circuit 3, a second row address generation circuit 4, and an address selection circuit 5.

The command selection/transmission circuit 1 may generate a first internal command IREF1 and a second internal command IREF2 from a command REF in response to a test flag TFLAG and a test end signal TENDB. The test flag TFLAG may be enabled to execute a test operation generating a row address which is sequentially counted to execute a refresh operation of a predetermined memory region. The test end signal TENDB may be enabled if the test operation terminates. The command selection/transmission circuit 1 may buffer the command REF enabled for execution of the refresh operation to output the buffered command as the second internal command IREF2, in response to the test flag TFLAG enabled during the test operation and the test end signal TENDB disabled during the test operation. The first internal command IREF1 may be disabled while the second internal command IREF2 is enabled. The command selection/transmission circuit 1 may buffer the command REF enabled for execution of the refresh operation to output the buffered command as the first internal command IREF1, in response to the test end signal TENDB enabled after the test operation terminates. The command selection/transmission circuit 1 may generate the first internal command IREF1 which is enabled if the command REF enabled for execution of the refresh operation is inputted to the command selection/transmission circuit 1 before the test operation is performed. The second internal command IREF2 may be disabled while the first internal command IREF1 is enabled.

The target address storage circuit 2 may count the number of times that blocks (not illustrated) are selected by an address A<1:M> in response to an active pulse ACTP and may store and output the address A<1:M> of a block (not illustrated) selected at least a predetermined number of times as a target address TA<1:M>. The active pulse ACTP may be generated whenever an active operation of each of various logic level combinations of the address A<1:M> is performed. Positions of the blocks selected by various logic level combinations of the address A<1:M> may be set to be different according to the embodiments. The number "M" of bits included in the address A<1:M> may be set to be different according to the embodiments.

The first row address generation circuit 3 may generate a first row address RA1<1:M+N> in response to the first internal command IREF1. The first row address generation circuit 3 may generate the first row address RA1<1:M+N> that is sequentially counted while the first internal command IREF1 is enabled.

The second row address generation circuit 4 may generate a second row address RA2<1:M+N> from the target address TA<1:M> in response to the second internal command IREF2. The second row address generation circuit 4 may generate the second row address RA2<1:M+N> that is sequentially counted during a logic level combination period determined by the target address TA<1:M> while the second internal command IREF2 is enabled. The logic level combination period may be set to be a period from a predetermined start logic level combination to a predetermined end logic level combination. A first bit group RA2<1:M> of the second row address RA2<1:M+N> may be set to access to a block, and a second bit group RA2<M+1:M+N> of the second row address RA2<1:M+N> may be set to activate a word line included in the block. The number "M" of the first bit group RA2<1:M> and the number "N" of the second bit group RA2<M+1:M±N> may be set to be different according to the embodiments.

The address selection circuit 5 may output the first row address RA1<1:M+N> or the second row address RA2<1:M+N> as a selected row address RA_SEL<1:M+N> in response to the test flag TFLAG. The address selection circuit 5 may output the first row address RA1<1:M+N> as the selected row address RA_SEL<1:M+N> if the test flag TFLAG is enabled. The address selection circuit 5 may output the second row address RA2<1:M+N> as the selected row address RA_SEL<1:M+N> if the test flag TFLAG is disabled.

Figure 2:
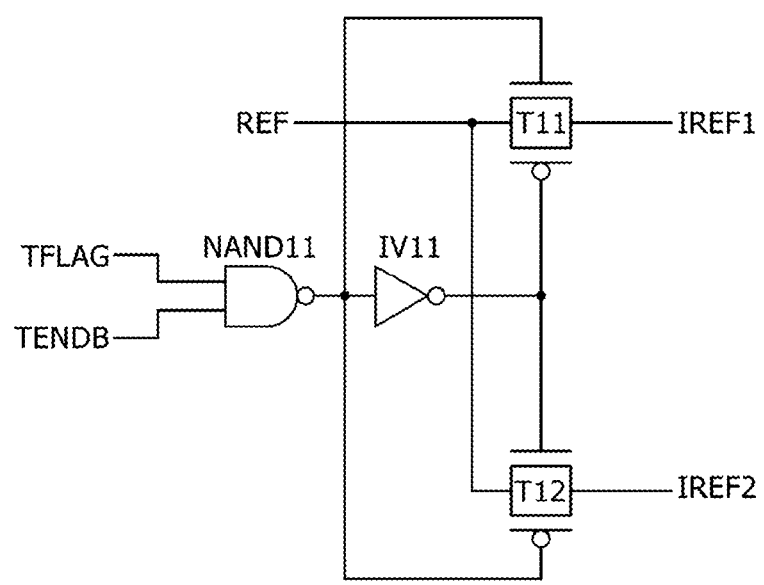
FIG. 2 is a block diagram illustrating a representation of an example of a command selection/transmission circuit included in the semiconductor device of FIG. 1.

Referring to FIG. 2, the command selection/transmission circuit 1 may include a NAND gate NAND11, an inverter IV11 and transfer gates T11 and T12. The NAND gate NAND11 may execute a NAND operation of the test flag TFLAG and the test end signal TENDB and may output a result of the NAND operation. The inverter IV11 may inversely buffer an output signal of the NAND gate NAND11 to output the inversely buffered signal. The transfer gate T11 may be turned on in response to the output signals of the NAND gate NAND11 and the inverter IV11 and may buffer the command REF to output the buffered command as the first internal command IREF1. The transfer gate T12 may be turned on in response to the output signals of the NAND gate NAND11 and the inverter IV11 and may buffer the command REF to output the buffered command as the second internal command IREF2.

Figure 3:
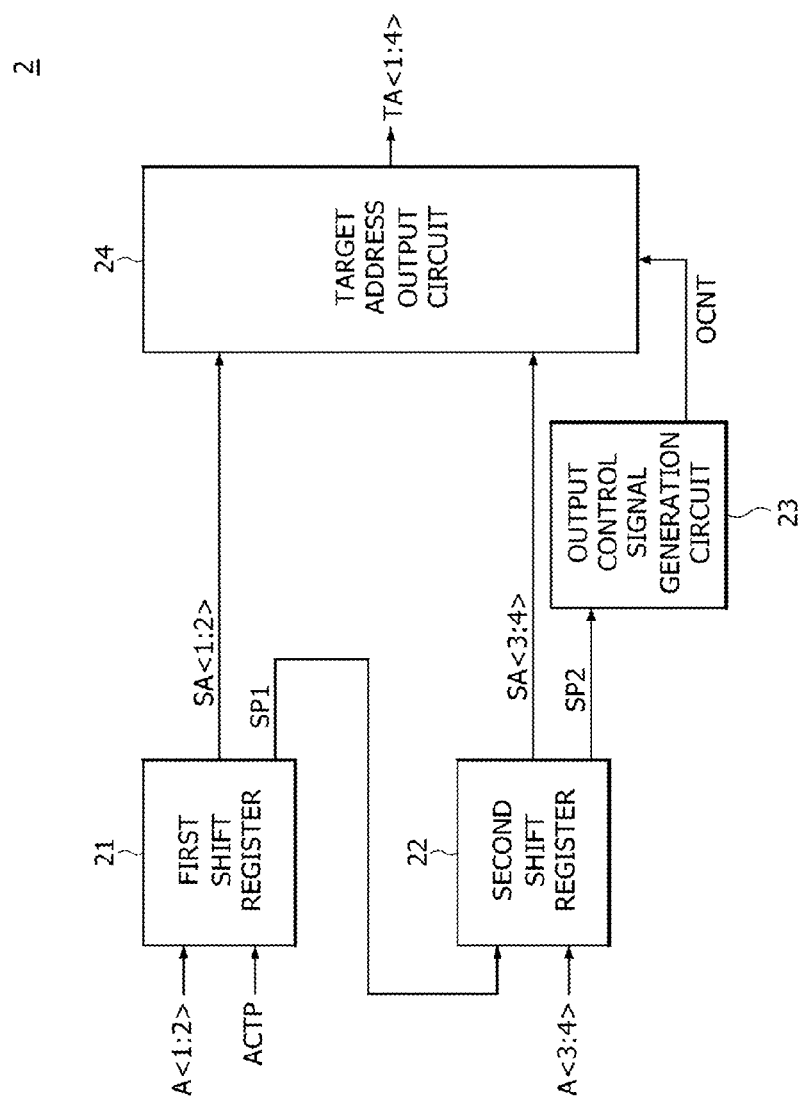
FIG. 3 is a block diagram illustrating a representation of an example of a target address storage circuit included in the semiconductor device of FIG. 1.

Referring to FIG. 3, the target address storage circuit 2 may include a first shift register 21, a second shift register 22, an output control signal generation circuit 23 and a target address output circuit 24.

The first shift register 21 may generate a first bit group SA<1:2> of a shift address and a first shifting pulse SP1 from a first bit group A<1:2> of the address, in response to the active pulse ACTP. The first shift register 21 may store a logic level combination of the first bit group A<1:2> inputted to the first shift register 21 whenever the active pulse ACTP is created and may output the first bit group A<1:2> having the same logic level combination at least twice as the first bit group SA<1:2> of the shift address. The first shift register 21 may generate the first shifting pulse SP1 if a logic level combination of the first bit group SA<1:2> is set and outputted in response to the first bit group A<1:2> having the same logic level combination at least twice. In some embodiments, the first shift register 21 may be realized to output the first bit group A<1:2> having the same logic level combination at least "K" times as the first bit group SA<1:2> of the shift address. The number "K" may be set to be a natural number which is equal to or greater than three. Although FIG. 3 illustrates an example in which each of the first bit group A<1:2> of the address and the first bit group SA<1:2> of the shift address has two bits, the present disclosure is not limited thereto. For example, in some embodiments, the number of bits included in the first bit group of the address and the first bit group of the shift address may be set to be different from two.

The second shift register 22 may generate a second bit group SA<3:4> of the shift address and a second shifting pulse SP2 from a second bit group A<3:4> of the address, in response to the first shifting pulse SP1. The second shift register 22 may store a logic level combination of the second bit group A<3:4> inputted to the second shift register 22 whenever the first shifting pulse SP1 is created and may output the second bit group A<3:4> having the same logic level combination at least twice as the second bit group SA<3:4> of the shift address. The second shift register 22 may generate the second shifting pulse SP2 if a logic level combination of the second bit group SA<3:4> is set and outputted in response to the second bit group A<3:4> having the same logic level combination at least twice. In some embodiments, the second shift register 22 may be realized to output the second bit group A<3:4> having the same logic level combination at least "K" times as the second bit group SA<3:4> of the shift address. The number "K" may be set to be a natural number which is equal to or greater than three. Although FIG. 3 illustrates an example in which each of the second bit group A<3:4> of the address and the second bit group SA<3:4> of the shift address has two bits, the present disclosure is not limited thereto. For example, in some embodiments, the number of bits included in the second bit group of the address and the second bit group of the shift address may be set to be different from two.

The output control signal generation circuit 23 may generate an output control signal OCNT in response to the second sifting pulse SP2. The output control signal generation circuit 23 may generate the output control signal OCNT which is enabled if a logic level combination of the second bit group SA<3:4> of the shift address is set by the second bit group A<3:4> having the same logic level combination at least twice so that the second shifting pulse SP2 is created.

The target address output circuit 24 may generate the target address TA<1:4> from the first bit group SA<1:2> of the shift address and the second bit group SA<3:4> of the shift address, in response to the output control signal OCNT. The target address output circuit 24 may set a logic level combination of the target address TA<1:4> from a logic level combination of the first bit group SA<1:2> of the shift address and a logic level combination of the second bit group SA<3:4> of the shift address, if the output control signal OCNT is enabled. For example, a logic level combination of a first bit group TA<1:2> of the target address TA<1:4> may be set to be a logic level combination of the first bit group SA<1:2> of the shift address, and a logic level combination of a second bit group TA<3:4> of the target address TA<1:4> may be set to be a logic level combination of the second bit group SA<3:4> of the shift address. A scheme for extracting a logic level combination of the target address TA<1:4> from the first and second bit groups SA<1:2> and SA<3:4> of the shift address may be set to be different according to the embodiments.

Figure 4:
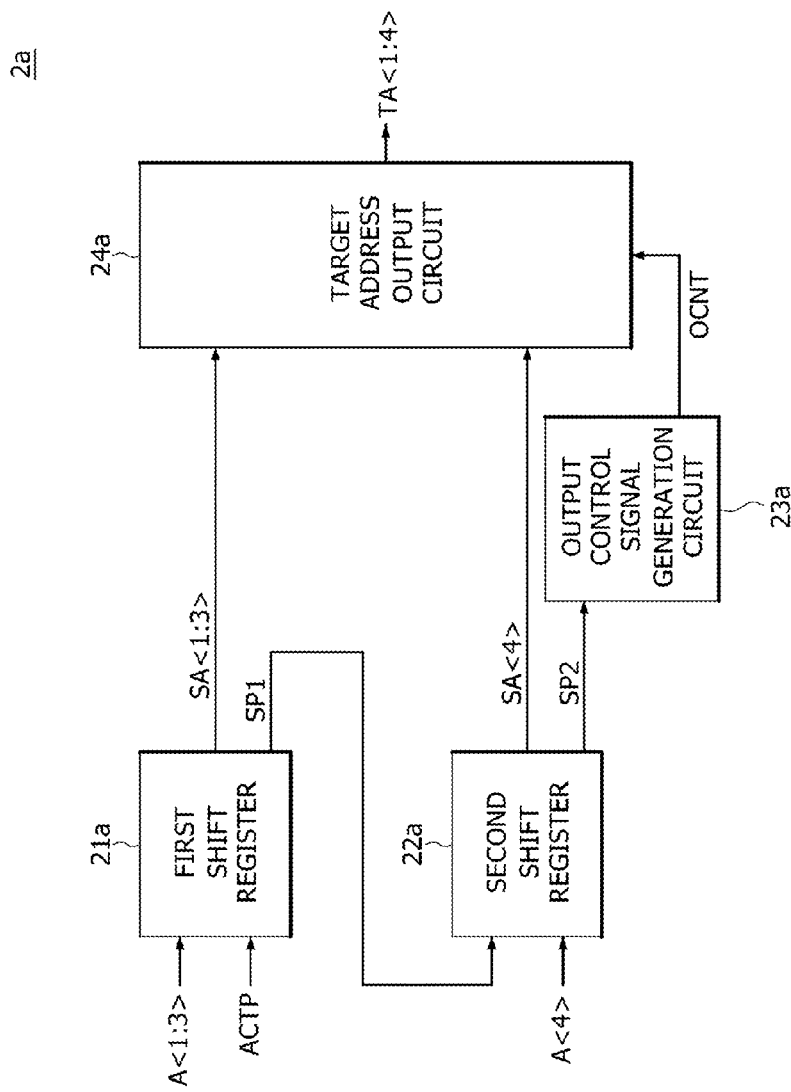
FIG. 4 is a block diagram illustrating a representation of an example of a target address storage circuit included in the semiconductor device of FIG. 1.

Referring to FIG. 4, a target address storage circuit 2a being able to replace the target address storage circuit 2 of FIG. 3 may include a first shift register 21a, a second shift register 22a, an output control signal generation circuit 23a and a target address output circuit 24a.

The first shift register 21a may generate a bit group SA<1:3> of a shift address and a first shifting pulse SP1 from a bit group A<1:3> of the address, in response to the active pulse ACTP. The first shift register 21a may store a logic level combination of the bit group A<1:3> inputted to the first shift register 21a whenever the active pulse ACTP is created and may output the bit group A<1:3> having the same logic level combination at least twice as the bit group SA<1:3> of the shift address. The first shift register 21a may generate the first shifting pulse SP1 if a logic level combination of the bit group SA<1:3> is set and outputted in response to the bit group A<1:3> having the same logic level combination at least twice. In some embodiments, the first shift register 21a may be realized to output the bit group A<1:3> having the same logic level combination at least "K" times as the bit group SA<1:3> of the shift address. The number "K" may be set to be a natural number which is equal to or greater than three. Although FIG. 4 illustrates an example in which each of the bit group A<1:3> of the address and the bit group SA<1:3> of the shift address has three bits, the present disclosure is not limited thereto. For example, in some embodiments, the number of bits included in the bit group of the address and the bit group of the shift address may be set to be different from three.

The second shift register 22a may generate a unit bit SA<4> of the shift address and a second shifting pulse SP2 from a unit bit A<4> of the address, in response to the first shifting pulse SP1. The second shift register 22a may store a logic level of the unit bit A<4> inputted to the second shift register 22a whenever the first shifting pulse SP1 is created and may output the unit bit A<4> having the same logic level at least twice as the unit bit SA<4> of the shift address. The second shift register 22a may generate the second shifting pulse SP2 if a logic level of the unit bit SA<4> is set and outputted in response to the unit bit A<4> having the same logic level at least twice. In some embodiments, the second shift register 22a may be realized to output the unit bit A<4> having the same logic level at least "K" times as the unit bit SA<4> of the shift address. The number "K" may be set to be a natural number which is equal to or greater than three. Although FIG. 4 illustrates an example in which each of the unit bit A<4> of the address and the unit bit SA<4> of the shift address has one bit, the present disclosure is not limited thereto. For example, in some embodiments, the number of bits included in the unit bit of the address and the unit bit of the shift address may be set to be different from one.

The output control signal generation circuit 23a may generate an output control signal OCNT in response to the second sifting pulse SP2. The output control signal generation circuit 23a may generate the output control signal OCNT which is enabled if a logic level of the unit bit SA<4> of the shift address is set by the unit bit A<4> having the same logic level at least twice so that the second shifting pulse SP2 is created.

The target address output circuit 24a may generate the target address TA<1:4> from the bit group SA<1:3> of the shift address and the unit bit SA<4> of the shift address, in response to the output control signal OCNT. The target address output circuit 24a may set a logic level combination of the target address TA<1:4> from a logic level combination of the bit group SA<1:3> of the shift address and a logic level of the unit bit SA<4> of the shift address, if the output control signal OCNT is enabled. For example, a logic level combination of a bit group TA<1:3> of the target address TA<1:4> may be set to be a logic level combination of the bit group SA<1:3> of the shift address, and a logic level of a unit bit TA<4> of the target address TA<1:4> may be set to be a logic level of the unit bit SA<4> of the shift address. A scheme for extracting a logic level combination of the target address TA<1:4> from the bit group SA<1:3> of the shift address and the unit bit SA<4> of the shift address may be set to be different according to the embodiments.

Figure 5:
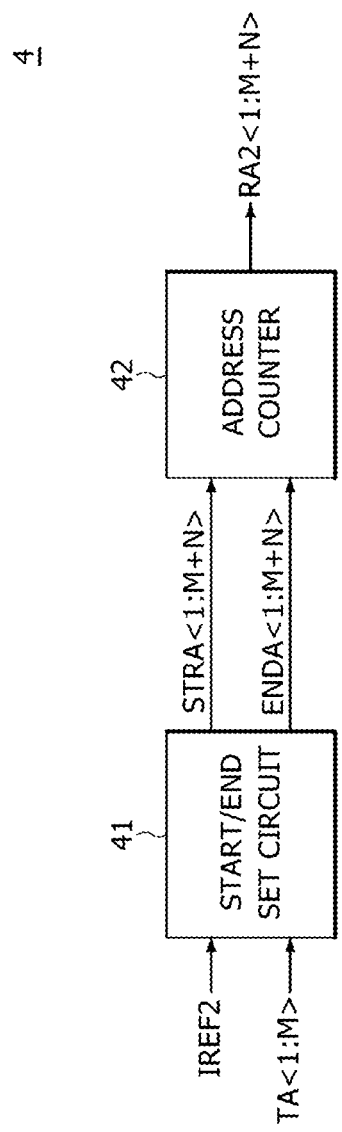
FIG. 5 is a block diagram illustrating a representation of an example of a second row address generation circuit included in the semiconductor device of FIG. 1.

Referring to FIG. 5, the second row address generation circuit 4 may include a start and end (start/end) set circuit 41 and an address counter 42.

The start/end set circuit 41 may generate a start address STRA<1:M+N> and an end address ENDA<1:M+N> from the target address TA<1:M> in response to the second internal command IREF2. The start/end set circuit 41 may generate the start address STRA<1:M+N> and the end address ENDA<1:M+N> that have logic level combinations corresponding to word lines included in a target block selected by the target address TA<1:M> or word lines included in a next block adjacent to the target block, if the second internal command IREF2 is generated. The target block and the next block including word lines corresponding to the logic level combinations of the start address STRA<1:M+N> and the end address ENDA<1:M+N> may be set to be different according to the embodiments. The number of bits included in the start address STRA<1:M+N> and the end address ENDA<1:M+N> may also be set to be different according to the embodiments.

The address counter 42 may generate the second row address RA2<1:M+N> in response to the start address STRA<1:M+N> and the end address ENDA<1:M+N>. The address counter 42 may generate the second row address RA2<1:M+N> that are sequentially counted from a logic level combination of the start address STRA<1:M+N> to a logic level combination of the end address ENDA<1:M+N>. For example, if the start address STRA<1:M+N> is set to have a logic level combination of '001' and the end address ENDA<1:M+N> is set to have a logic level combination of '111', the address counter 42 may generate the second row address RA2<1:M+N> that are counted up bit by bit to have logic level combinations of '001', '010', '011', '100', '101', '110' and '111' in sequence.

Referring to FIG. 6, the address A<1:4> corresponding to a first block BLOCK1 may be set to have a logic level combination of '0000', the address A<1:4> corresponding to a second block BLOCK2 may be set to have a logic level combination of '1000', the address A<1:4> corresponding to a third block BLOCK3 may be set to have a logic level combination of '0100', and the address A<1:4> corresponding to a sixteenth block BLOCK16 may be set to have a logic level combination of '1111'. In a present embodiment, each of the first to sixteenth blocks BLOCK1~BLOCK16 may be realized to include four word lines, and the addresses A<5:6> corresponding to the four word lines included in each block may be set to have logic level combinations of '00', '01', '10' and '11', respectively.

Figure 7:
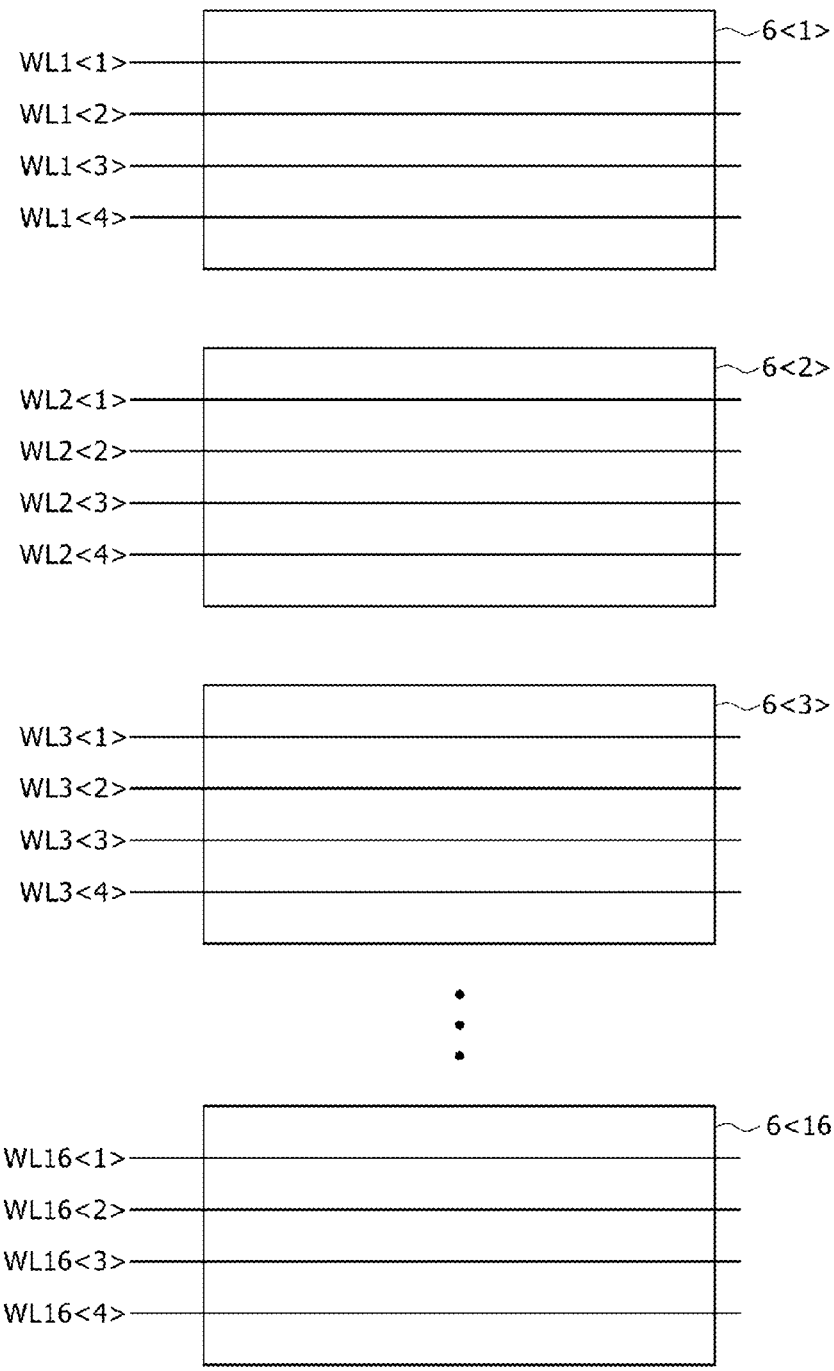
FIG. 7 is a schematic view of a core region illustrating a representation of an example of an operation of the semiconductor device illustrated in FIGS. 1 to 5.

Referring to FIG. 7, a core region 6 included in the semiconductor device of FIG. 1 may include first to sixteenth blocks 6<1:16>. The first block 6<1> may correspond to the first block BLOCK1 illustrated in FIG. 6, the second block 6<2> may correspond to the second block BLOCK2 illustrated in FIG. 6, the third block 6<3> may correspond to the third block BLOCK3 illustrated in FIG. 6, and the sixteenth block 6<16> may correspond to the sixteenth block BLOCK16 illustrated in FIG. 6.

The first block 6<1> may include first to fourth word lines WL1<1:4>. The address A<5:6> for activating the first word line WL1<1> included in the first block 6<1> may be set to have a logic level combination of '00'. The address A<5:6> for activating the second word line WL1<2> included in the first block 6<1> may be set to have a logic level combination of '01'. The address A<5:6> for activating the third word line WL1<3> included in the first block 6<1> may be set to have a logic level combination of '10'. The address A<5:6> for activating the fourth word line WL1<4> included in the first block 6<1> may be set to have a logic level combination of '11'.

The second block 6<2> may include first to fourth word lines WL2<1:4>. The address A<5:6> for activating the first word line WL2<1> included in the second block 6<2> may be set to have a logic level combination of '00'. The address A<5:6> for activating the second word line WL2<2> included in the second block 6<2> may be set to have a logic level combination of '01'. The address A<5:6> for activating the third word line WL2<3> included in the second block 6<2> may be set to have a logic level combination of '10'. The address A<5:6> for activating the fourth word line WL2<4> included in the second block 6<2> may be set to have a logic level combination of '11'.

The third block 6<3> may include first to fourth word lines WL3<1:4>. The address A<5:6> for activating the first word line WL3<1> included in the third block 6<3> may be set to have a logic level combination of '00'. The address A<5:6> for activating the second word line WL3<2> included in the third block 6<3> may be set to have a logic level combination of '01'. The address A<5:6> for activating the third word line WL3<3> included in the third block 6<3> may be set to have a logic level combination of '10'. The address A<5:6> for activating the fourth word line WL3<4> included in the third block 6<3> may be set to have a logic level combination of '11'.

The sixteenth block 6<16> may include first to fourth word lines WL16<1:4>. The address A<5:6> for activating the first word line WL16<1> included in the sixteenth block 6<16> may be set to have a logic level combination of '00'. The address A<5:6> for activating the second word line WL16<2> included in the sixteenth block 6<16> may be set to have a logic level combination of '01'. The address A<5:6> for activating the third word line WL16<3> included in the sixteenth block 6<16> may be set to have a logic level combination of '10'. The address A<5:6> for activating the fourth word line WL16<4> included in the sixteenth block 6<16> may be set to have a logic level combination of '11'.

A test operation of the semiconductor device having an aforementioned configuration will be described hereinafter.

If the test flag TFLAG is enabled to execute the test operation, the command REF enabled for execution of a refresh operation may be buffered and the buffered command may be outputted as the second internal command IREF2.

The second row address generation circuit 4 may generate the second row address RA2<1:M+N> that is sequentially counted during the logic level combination period which is determined by the target address TA<1:M> while the second internal command IREF2 is enabled. A logic level combination of the target address TA<1:M> may be set to be a logic level combination of the address A<1:M> corresponding to the target block selected at least a predetermined number of times in response to the active pulse ACTP. The logic level combination period may be set by logic level combinations included in the target block or a block adjacent to the target block. Generation of the second row address RA2<1:M+N> will be described hereinafter with reference to FIGS. 6 and 7 in which the core region includes sixteen blocks and each block includes four word lines. The number of blocks and the number of word lines may be set to be different according to the embodiments.

In an embodiment, while the target address TA<1:4> is set to have a logic level combination of '1000', the second row address generation circuit 4 may generate the second row address RA2<1:6> that is sequentially counted so that a refresh operation of the second block 16<2> corresponding to the target block selected by the target address TA<1:4> is performed during the test operation. In such a case, the second row address RA2<1:6> may be counted to have logic level combinations of '100000', '100001', '100010' and '100011' in sequence.

In an embodiment, while the target address TA<1:4> is set to have a logic level combination of '1000', the second row address generation circuit 4 may generate the second row address RA2<1:6> that is sequentially counted so that the second block 16<2> corresponding to the target block, the first block 16<1> adjacent to the target block, and the third block 16<3> adjacent to the target block are refreshed during the test operation. In such a case, the second row address RA2<1:6> may be counted to have logic level combinations of '000011', '100000', '100001', '100010', '100011' and '010000' in sequence. The first logic level combination (i.e., '000011') of the second row address RA2<1:6> may be replaced with any one of the logic level combinations of '000010', '000001' and '000000'. The final logic level combination (i.e., '010000') of the second row address RA2<1:6> may be replaced with any one of the logic level combinations of '010001', '010010' and '010011'.

Although the above semiconductor device is described in conjunction with an example in which the target address is generated to execute a refresh operation, the present disclosure is not limited thereto. For example, the embodiments may also be applied to examples in which the target address is generated to execute various internal operations of the semiconductor device.

Figure 8:
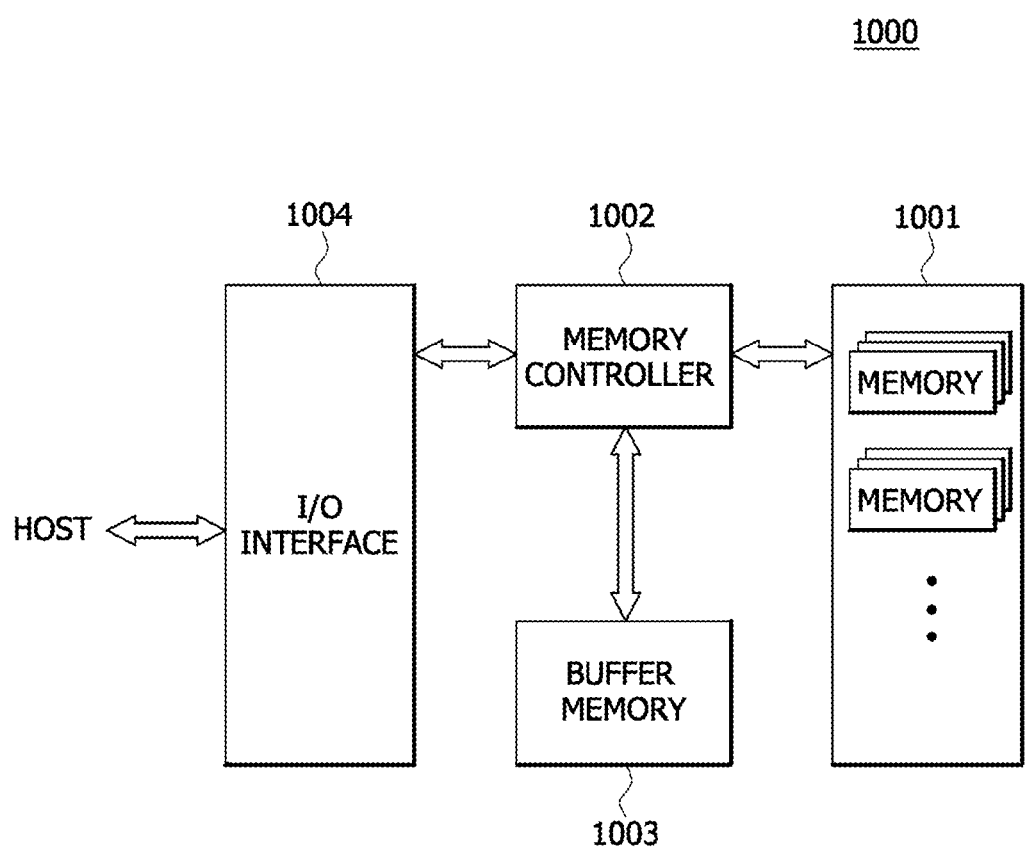
FIG. 8 is a block diagram illustrating a representation of an example of a configuration of an electronic system including the semiconductor device shown in FIG. 1.

The semiconductor devices described with reference to FIGS. 1 to 7 may be applied to an electronic system that includes a memory system, a graphic system, a computing system, a mobile system, or the like. For example, as illustrated in FIG. 8, an electronic system 1000 according an embodiment may include a data storage circuit 1001, a memory controller 1002, a buffer memory 1003, and an input and output (input/output) (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor device illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the input and output (I/O) interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 10 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the embodiments described above, a semiconductor device may perform a refresh operation of a block, which is frequently selected, to prevent loss of data stored in the block.

In addition, the semiconductor devices may divide an address including a plurality of bits into at least two bit groups and may verify whether each bit group is selected or not to reduce the number of registers that are required to store the counted number of times of the logic level combinations of the address.

What is claimed is:

1. A semiconductor device comprising:
   a target address storage circuit configured to count the number of times that blocks are selected by a plurality of logic level combinations of an address based on an active pulse and configured to store and output the address of a target block, which is selected at least a predetermined number of times, among the blocks as a target address; and
   a first row address generation circuit configured to generate a first row address, which is sequentially counted, from the target address based on a first internal command.

2. The semiconductor device of claim 1, wherein the target address storage circuit is configured to divide the address into a first bit group and a second bit group, configured to sense a first logic level combination inputted at least the predetermined number of times based on the active pulse among logic level combinations of the first bit group included in the address, configured to sense a second logic level combination inputted at least the predetermined number of times based on the active pulse among logic level combinations of the second bit group included in the address, and configured to set a logic level combination of the target address from the first logic level combination of the first bit group included in the address and the second logic level combination of the second bit group included in the address.

3. The semiconductor device of claim 1,
   wherein the target address storage circuit includes a first shift register; and
   wherein the first shift register is configured to set a first logic level combination, which is inputted at least the predetermined number of times based on the active pulse, among logic level combinations of a first bit group included in the address as a logic level combination of a bit group included in a first shift address and configured to generate a first shifting pulse if the logic level combination of the bit group included in the first shift address is outputted.

4. The semiconductor device of claim 3,
wherein the target address storage circuit further includes a second shift register; and
wherein the second shift register is configured to set a second logic level combination, which is inputted at least the predetermined number of times based on the first shifting pulse, among logic level combinations of a second bit group included in the address as a logic level combination of a bit group included in a second shift address and configured to generate a second shifting pulse if the logic level combination of the bit group included in the second shift address is outputted.

5. The semiconductor device of claim 4,
wherein the target address storage circuit further includes an output control signal generation circuit; and
wherein the output control signal generation circuit is configured to generate an output control signal based on the second shifting pulse.

6. The semiconductor device of claim 4,
wherein the target address storage circuit further includes a target address output circuit; and
wherein the target address output circuit is configured to set a logic level combination of the target address from the logic level combination of the bit group included in the first shift address and the logic level combination of the bit group included in the second shift address and configured to output the logic level combination of the target address.

7. The semiconductor device of claim 1, wherein the target address storage circuit is configured to divide the address into a bit group and a unit bit, configured to sense a logic level combination inputted at least the predetermined number of times based on the active pulse among logic level combinations of the bit group included in the address, configured to sense a logic level inputted at least the predetermined number of times based on the active pulse among logic levels of the unit bit included in the address, and configured to set a logic level combination of the target address from the sensed logic level combination of the bit group included in the address and the sensed logic level of the unit bit included in the address.

8. The semiconductor device of claim 1,
wherein the target address includes a first bit group and a second bit group;
wherein the first bit group of the target address is provided to select any one of the blocks; and
wherein the second bit group of the target address is provided to activate any one of word lines included in the selected block.

9. The semiconductor device of claim 1,
wherein the first row address is sequentially counted during a logic level combination period which is determined by the target address; and
wherein the logic level combination period is set to be a period from a predetermined start logic level combination to a predetermined end logic level combination.

10. The semiconductor device of claim 9, wherein the predetermined start logic level combination and the predetermined end logic level combination are set to activate word lines included in the target block selected by the target address or to activate word lines included in the target block and a next block adjacent to the target block.

11. The semiconductor device of claim 1, wherein the first row address generation circuit includes:
a start and end (start/end) set circuit configured to generate a logic level combination of a start address and a logic level combination of an end address from the target address based on the first internal command; and
an address counter configured to output the first row address that is sequentially counted from the logic level combination of the start address till the logic level combination of the end address.

12. The semiconductor device of claim 1, further comprising a command selection and transmission (selection/transmission) circuit configured to receive a command to output the command as the first internal command or a second internal command, based on a test flag.

13. The semiconductor device of claim 12, further comprising a second row address generation circuit configured to generate a second row address based on the second internal command.

14. The semiconductor device of claim 1, further comprising an address selection circuit configured to output the first row address as a selected row address if a test operation is performed and configured to output a second row address, which is generated based on a second internal command, as the selected row address if the test operation is not performed.

15. A semiconductor device comprising:
a command selection and transmission (selection/transmission) circuit configured to receive a command to output the command as a first internal command or a second internal command, based on a test flag;
a target address storage circuit configured to count the number of times that blocks are selected by a plurality of logic level combinations of an address based on an active pulse and configured to store and output the address of a target block, which is selected at least a predetermined number of times, among the blocks as a target address;
a first row address generation circuit configured to generate a first row address, which is sequentially counted, from the target address based on the first internal command;
a second row address generation circuit configured to generate a second row address based on the second internal command; and
an address selection circuit configured to output the first row address or the second row address as a selected row address for executing a refresh operation.

16. The semiconductor device of claim 15, wherein the test flag is enabled for a test operation that executes the refresh operation of the target block.

17. The semiconductor device of claim 15, wherein the test flag is enabled for a test operation that executes the refresh operation of the target block and a next block adjacent to the target block.

18. The semiconductor device of claim 15,
wherein the command selection/transmission circuit outputs the command as the first internal command if the test flag is enabled; and
wherein the command selection/transmission circuit outputs the command as the second internal command if the test flag is disabled.

19. The semiconductor device of claim 15,
wherein the address selection circuit outputs the first row address as the selected row address if the test flag is enabled; and
wherein the address selection circuit outputs the second row address as the selected row address if the test flag is disabled.

20. The semiconductor device of claim 15, wherein the target address storage circuit is configured to divide the address into a first bit group and a second bit group, configured to sense a first logic level combination inputted at least the predetermined number of times based on the active pulse among logic level combinations of the first bit group included in the address, configured to sense a second logic level combination inputted at least the predetermined number of times based on the active pulse among logic level combinations of the second bit group included in the address, and configured to set a logic level combination of the target address from the first logic level combination of the first bit group included in the address and the second logic level combination of the second bit group included in the address.

* * * * *